United States Patent
Ha et al.

(10) Patent No.: US 10,404,927 B2
(45) Date of Patent: Sep. 3, 2019

(54) CORRELATED DOUBLE SAMPLING (CDS) CIRCUIT FOR DECREASING SETTLING TIME AND IMAGE SENSOR INCLUDING THE SAME

(71) Applicant: Samsung Electronics Co., Ltd., Suwon-si, Gyeonggi-do (KR)

(72) Inventors: Sang Hoon Ha, Seongnam-si (KR); Ji Yong Park, Seoul (KR); Kwang Hyun Lee, Seongnam-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 15/913,033

(22) Filed: Mar. 6, 2018

(65) Prior Publication Data

US 2018/0198996 A1 Jul. 12, 2018

Related U.S. Application Data

(62) Division of application No. 15/438,060, filed on Feb. 21, 2017, now Pat. No. 9,942,496.

(30) Foreign Application Priority Data

Apr. 5, 2016 (KR) ........................ 10-2016-0041829

(51) Int. Cl.
| | | |
|---|---|---|
| H04N 5/357 | (2011.01) | |
| H04N 5/363 | (2011.01) | |
| H04N 5/365 | (2011.01) | |
| H04N 5/374 | (2011.01) | |
| H04N 5/378 | (2011.01) | |

(Continued)

(52) U.S. Cl.
CPC ..... *H04N 5/3575* (2013.01); *H01L 27/14634* (2013.01); *H01L 27/14645* (2013.01); *H04N 5/363* (2013.01); *H04N 5/3658* (2013.01); *H04N 5/374* (2013.01); *H04N 5/378* (2013.01); *H04N 5/37455* (2013.01)

(58) Field of Classification Search
CPC .... H04N 5/3575; H04N 5/363; H04N 5/3658; H04N 5/37455; H04N 5/378; H01L 27/14634; H01L 27/14645
See application file for complete search history.

(56) References Cited

U.S. PATENT DOCUMENTS

| | | | |
|---|---|---|---|
| 7,230,558 B2 | 6/2007 | Lim | |
| 7,279,940 B1 * | 10/2007 | Min | ................... G11C 27/026 327/337 |
| 7,301,487 B2 | 11/2007 | Funakoshi et al. | |

(Continued)

*Primary Examiner* — Nicholas G Giles
(74) *Attorney, Agent, or Firm* — Harness, Dickey & Pierce, P.L.C.

(57) ABSTRACT

A correlated double sampling (CDS) circuit includes a comparator and a first circuit. The comparator including, a first input terminal, a second input terminal, at least one output terminal, and a plurality of first transistors operably coupled between the at least one output terminal and the first and second input terminals. The first circuit includes at least one second transistor, the at least one second transistor operably coupled to the at least one output terminal and one of the first input terminal and the second input terminal, the at least one second transistor having at least one of (i) a different number of layers than the first transistors, and (ii) a different dimension than the first transistors.

15 Claims, 11 Drawing Sheets

(51) Int. Cl.
    *H01L 27/146*         (2006.01)
    *H04N 5/3745*         (2011.01)

(56)             References Cited

U.S. PATENT DOCUMENTS 8,130,125  B2    3/2012   Hoshino
    8,354,630  B2    1/2013   Hoshino
    8,411,186  B2    4/2013   Iwasa
    8,493,139  B2    7/2013   Sayuk
    8,576,317  B2   11/2013   Sakakibara et al.
    9,319,609  B2    4/2016   Kasuga et al.
    2003/0107661 A1   6/2003   Pahr et al.
    2011/0242381 A1  10/2011   Sakakibara et al.
    2013/0009800 A1   1/2013   Yang et al.
    2014/0291482 A1  10/2014   Tanaka et al.
    2014/0306295 A1  10/2014   Kim
    2015/0189209 A1   7/2015   Yang et al.
    2015/0229859 A1   8/2015   Guidash et al.
    2015/0237285 A1   8/2015   Tanaka et al.

* cited by examiner

CORRELATED DOUBLE SAMPLING (CDS) CIRCUIT FOR DECREASING SETTLING TIME AND IMAGE SENSOR INCLUDING THE SAME

CROSS-REFERENCE TO RELATED APPLICATION

This application is a divisional application of and claims priority under 35 U.S.C. § 120/121 to U.S. application Ser. No. 15/438,060, filed Feb. 21, 2017, which claims the benefit of Korean Patent Application No. 10-2016-0041829, filed on Apr. 5, 2016, in the Korean Intellectual Property Office, each of which are hereby incorporated by reference herein in their entirety.

BACKGROUND

One or more example embodiments of inventive concepts relate to a correlated double sampling (CDS) circuit such as a CDS circuit configured to decrease a settling time and an image sensor including the same.

A single-slope analog-digital converting method has been widely used as an analog-digital converting method in the field of image sensor.

In this method, a ramp signal and a pixel signal having a certain voltage are compared with each other and a time or a point of time at which a voltage of the ramp signal and a voltage of the pixel signal are equal to each other is converted into a digital signal on the basis of a result of comparing these signals with each other.

In a column parallel analog-digital converting method, one or more column analog-digital converters (ADCs) should be integrated in one pixel pitch. Thus, the single-slope analog-digital converting method has been widely used in consideration of layout area and power consumption.

An image sensor employs CDS, and counts a signal sampled through CDS, e.g., the difference between a reset signal and an image signal, and outputs a digital signal.

Recently, high-resolution and high-frame-rate (HFR) driving technologies have been used in the field of complementary metal-oxide semiconductor (CMOS) image sensor (CIS). In particular, when an image of a fast moving object is captured, performing an HFR operation of 120 fps (frame per second) or more is very important to suppress image distortion caused by a rolling shutter of a CIS.

For the HFR operation, a technique of decreasing a pixel settling time during an operation of an ADC of an image sensor has been suggested.

SUMMARY

According to an aspect of inventive concepts, a correlated double sampling (CDS) circuit includes a comparator configured to compare a pixel signal and a ramp signal with each other and output a comparison signal corresponding to a result of comparing the pixel signal and the ramp signal with each other, and a first switch and a second switch, each of the first switch and the second switch configured to remove an offset component of the comparator. The first switch and the second switch are configured to decrease a settling time between when switching operations of the first switch and the second switch are performed and when analog-digital conversion (ADC) is performed.

According to another aspect of inventive concepts, there is provided an image sensor including a pixel array having a plurality of pixels for outputting a pixel signal, a ramp signal generator for outputting a ramp signal, and a correlated double sampling (CDS) circuit. The CDS circuit includes a first capacitor configured to receive a pixel signal, a second capacitor configured to receive a ramp signal, a comparator configured to compare the pixel signal and the ramp signal with each other and output a comparison signal corresponding to a result of comparing the pixel signal and the ramp signal with each other, and a first switch and a second switch, each of the first switch and the second switch configured to remove an offset component of the comparator. The first switch and the second switch are configured to decrease a settling time between when switching operations of the first switch and the second switch are performed and when analog-digital conversion (ADC) is performed. The first switch and the second switch are transistors to which a silicon-germanium (cSiGe) process is not applied.

According to at least one example embodiment, a correlated double sampling (CDS) circuit includes a comparator and a first circuit. The comparator including, a first input terminal, a second input terminal, at least one output terminal, and a plurality of first transistors operably coupled between the at least one output terminal and the first and second input terminals. The first circuit includes at least one second transistor, the at least one second transistor operably coupled to the at least one output terminal and one of the first input terminal and the second input terminal, the at least one second transistor having at least one of (i) a different number of layers than the first transistors, and (ii) a different dimension than the first transistors.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1:
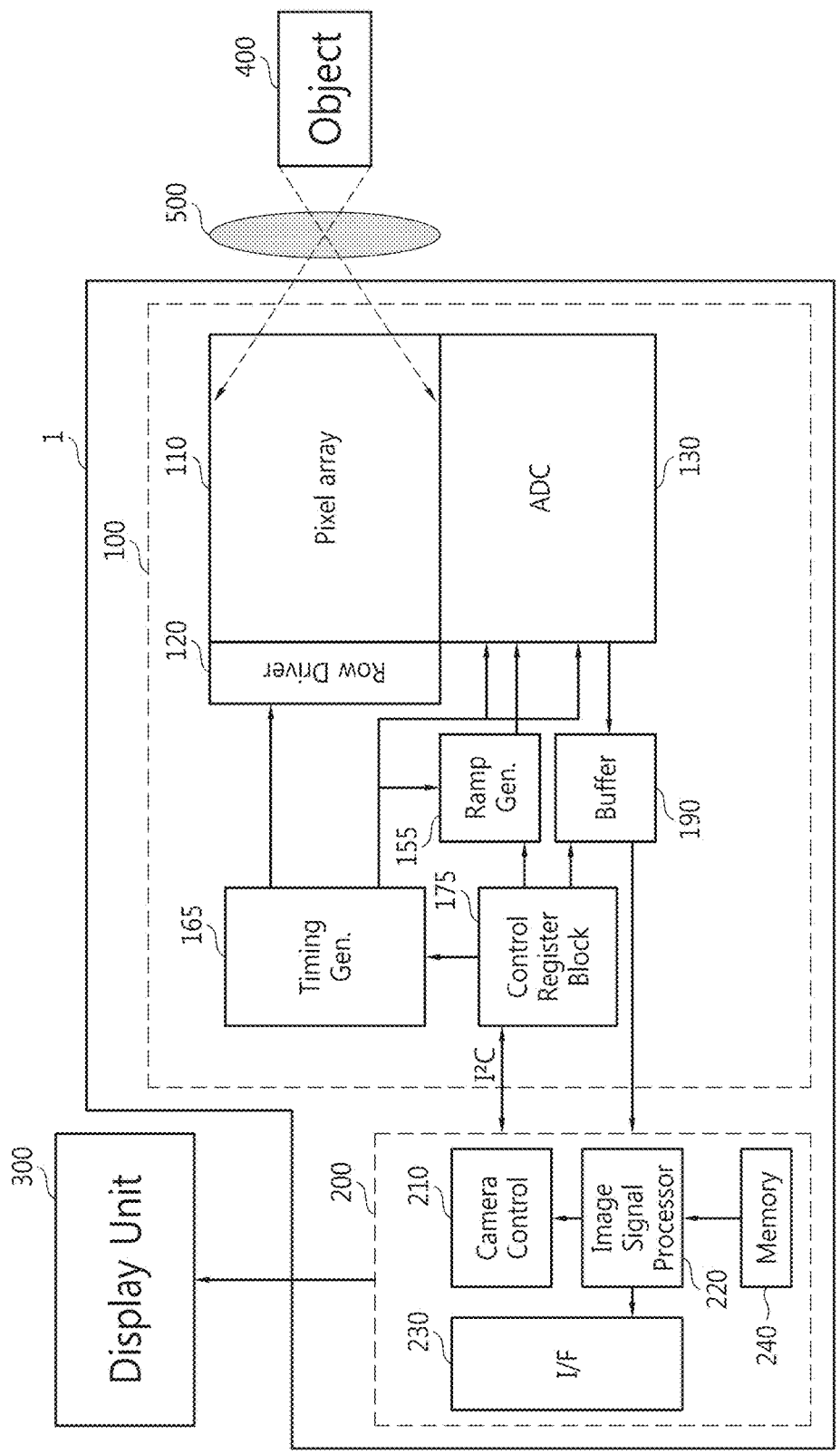
FIG. 1 is a schematic block diagram of an image sensing system including an image sensor according to an example embodiment of inventive concepts.
Figure 2:
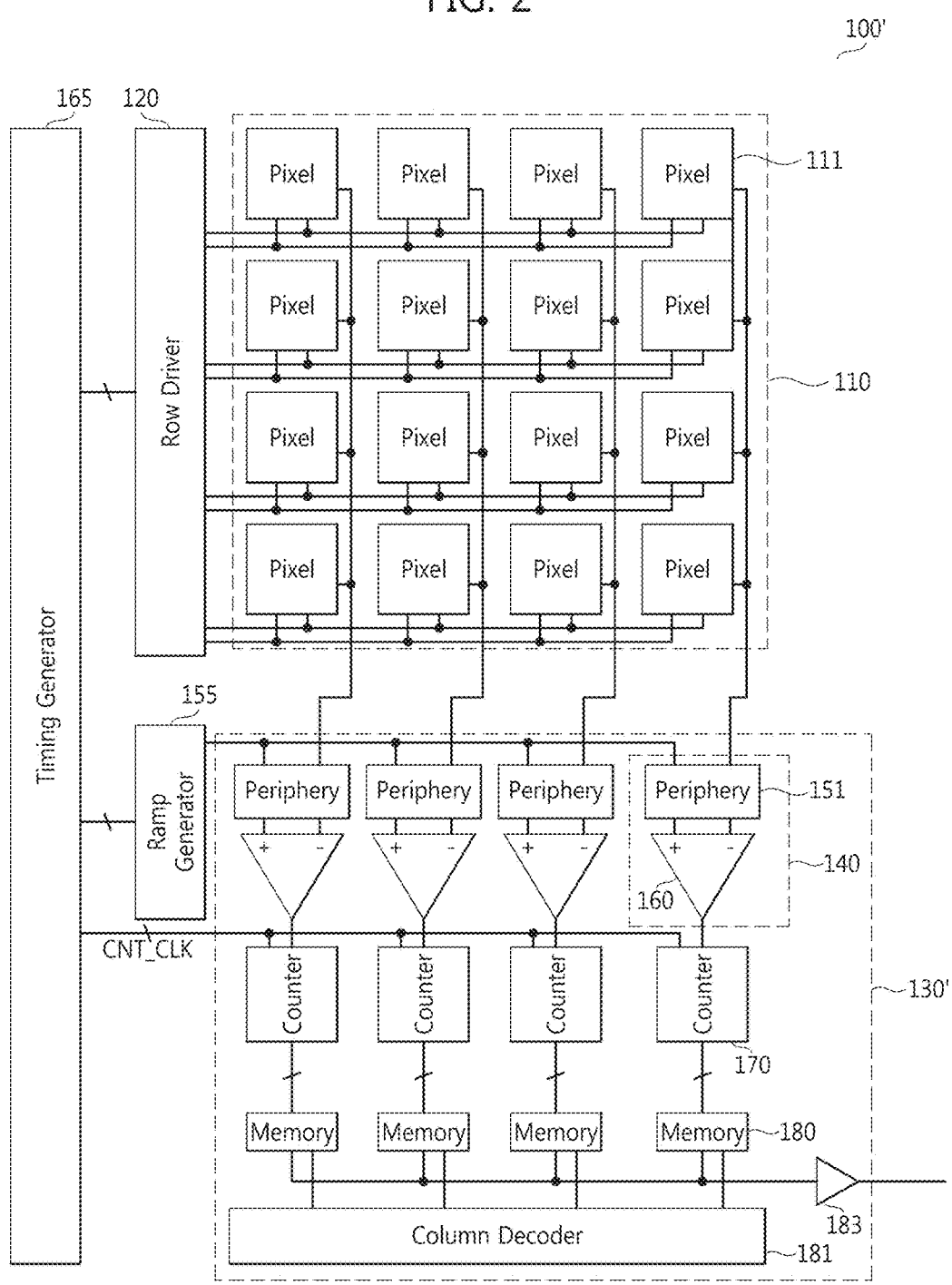
FIG. 2 is a detailed block diagram of the image sensor of FIG. 1.

FIG. 1 is a schematic block diagram of an image sensing system 1 including an image sensor 100 according to an example embodiment of inventive concepts. FIG. 2 is a detailed block diagram of the image sensor 100 of FIG. 1.

Referring to FIGS. 1 and 2, the image sensing system 1 includes the image sensor 100 and a digital signal processor 200.

The image sensing system 1 senses an image of an object 400 captured via a lens 500 under control of the digital signal processor 200. The digital signal processor 200 may output the image sensed by and output from the image sensor 100 to a display unit 300. Examples of the display unit 300 include various devices capable of outputting an image. For example, the display unit 300 may be a computer or, a mobile phone, but is not limited thereto.

The digital signal processor 200 includes a camera control 210, an image signal processor 220, a personal computer (PC) interface (IF) 230 and a memory 240. The camera control 210 controls a control register block 175. The camera control 210 may control the image sensor 100 (particularly, the control register block 175) by using an inter-integrated circuit ($I^2C$) but example embodiments of inventive concepts are not limited thereto.

Each of the camera control 210, the image signal processor 220 and the personal computer (PC) interface (IF) 230 may be implemented in hardware, a processor configured to execute software, firmware, or any combination thereof, for example. When at least one of the camera control 210, the image signal processor 220 and the personal computer (PC) interface (IF) 230 is hardware, such existing hardware may include one or more Central Processing Units (CPUs), digital signal processors (DSPs), application-specific-integrated-circuits (ASICs), field programmable gate arrays (FPGAs) computers or the like configured as special purpose machines to perform the functions of the at least one of the camera control 210, the image signal processor 220 and the personal computer (PC) interface (IF) 230. CPUs, DSPs, ASICs and FPGAs may generally be referred to as processors and/or microprocessors.

In the event where at least one of the camera control 210, the image signal processor 220 and the personal computer (PC) interface (IF) 230 is a processor executing software, the processor is configured as a special purpose machine to execute the software, stored in a storage medium (e.g., memory 240), to perform the functions of the at least one of camera control 210, the image signal processor 220 and the personal computer (PC) interface (IF) 230. In such an embodiment, the processor may include one or more Central Processing Units (CPUs), digital signal processors (DSPs), application-specific-integrated-circuits (ASICs), field programmable gate arrays (FPGAs) computers.

The image signal processor 220 receives image data which is an output signal of a buffer 190, processes/handles the image data so that it may be visible to human eyes, and outputs the processed/handled image data to the display unit 300 via the PC IF 230.

Although FIG. 1 illustrates that the image signal processor 220 is included in the digital signal processor 200, the position of the image signal processor 220 may be in another location. For example, the image signal processor 220 may be included in the image sensor 100.

The image sensor 100 includes a pixel array 110, a row driver 120, an analog-to-digital converter (hereinafter referred to as 'ADC') 130, a ramp signal generator 155, a timing generator 165, a control register block 175, and the buffer 190.

The pixel array 110 may include a plurality of pixels (e.g., pixels 111) in the form of a matrix, in which each of the plurality of pixels is connected to one of a plurality of rows and one of a plurality of columns.

The pixels 111 may include a red filter which transmits light of a red wavelength band, a green filter which transmits light of a green wavelength band, and a blue filter which transmits light of a blue wavelength band. In some example embodiments, the pixels 111 may include a cyan filter, a magenta filter, and a yellow filter.

Each of the pixels 111 includes a plurality of transistors and a photosensitive device (e.g., a photodiode or a pinned photodiode). Each of the pixels 111 senses light by using the photosensitive device, and converts the light into an electrical signal to generate an image signal.

The timing generator 165 may control operations of the row driver 120, the ADC 130, and the ramp signal generator 155 by outputting a control signal to the row driver 120, the ADC 130, and the ramp signal generator 155. The control register block 175 may control operations of the ramp signal generator 155, the timing generator 165, and the buffer 190 by outputting a control signal to the ramp signal generator 155, the timing generator 165, and the buffer 190. In this case, the control register block 175 is operated under control of the camera control 210. The camera control 210 may be embodied by hardware or hardware executing software.

The row driver 120 drives the pixel array 110 in units of the rows. For example, the row driver 120 may generate a row selection signal. That is, the row driver 120 may decode a row control signal (e.g., an address signal) generated by the timing generator 165, and select at least one among row lines of the pixel array 110 in response to the decoded row control signal. The pixel array 110 outputs, to the ADC 130, a reset signal and an image signal from a row selected according to the row selection signal provided from the row driver 120.

The ADC 130 includes a plurality of CDS circuits 140, a plurality of counters (e.g., counters 170), a plurality of memories (e.g., memories 180), a column decoder 181, and a sense amplifier 183.

Figure 3:
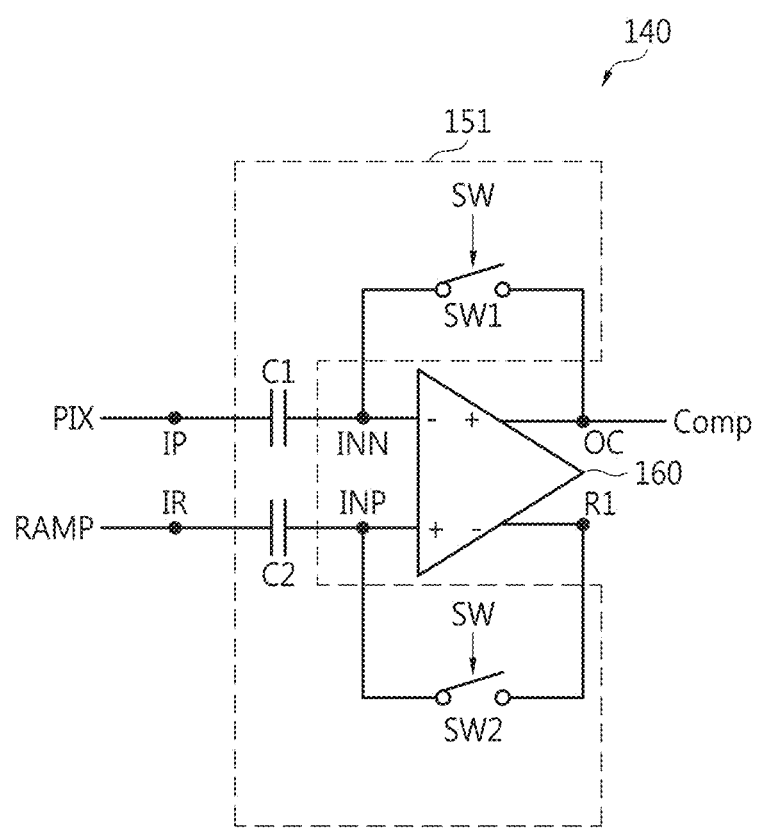
FIG. 3 is a detailed block diagram of a correlated double sampling (CDS) circuit according to some example embodiments of inventive concepts.

FIG. 3 is a more detailed block diagram of a CDS circuit 140 according to some example embodiments of inventive concepts. Referring to FIGS. 2 and 3, the CDS circuit 140 may include a peripheral circuit 151 and a comparator 160.

The peripheral circuit 151 includes a pair of capacitors C1 and C2 and a pair of switches SW1 and SW2.

The first capacitor C1 may be connected between a pixel signal input node IP and a first input node INN to compensate for an offset of the comparator 160 and a variation in a pixel reset level. For example, the first capacitor C1 may block a direct-current (DC) of a received pixel signal PIX and output a resultant signal to the comparator 160. The DC blocking may be understood as removing a DC component of a signal.

The first switch SW1 may be connected between the first input node INN and an output node OC to control an operation of the CDS circuit 140.

The second capacitor C2 may be connected between a ramp signal input node IR and a second input node INP to compensate for an offset of the comparator 160 and a variation in a ramp level. For example, the second capacitor C2 may block DC of a received ramp signal RAMP and output a resultant signal to the comparator 160.

The second switch SW2 may be connected between the second input node INP and a comparison node R1 to control a CDS operation. The first switch SW1 or the second switch SW2 may be controlled by a switch signal SW. The switch signal SW may be generated by the timing generator 165.

Figure 9:
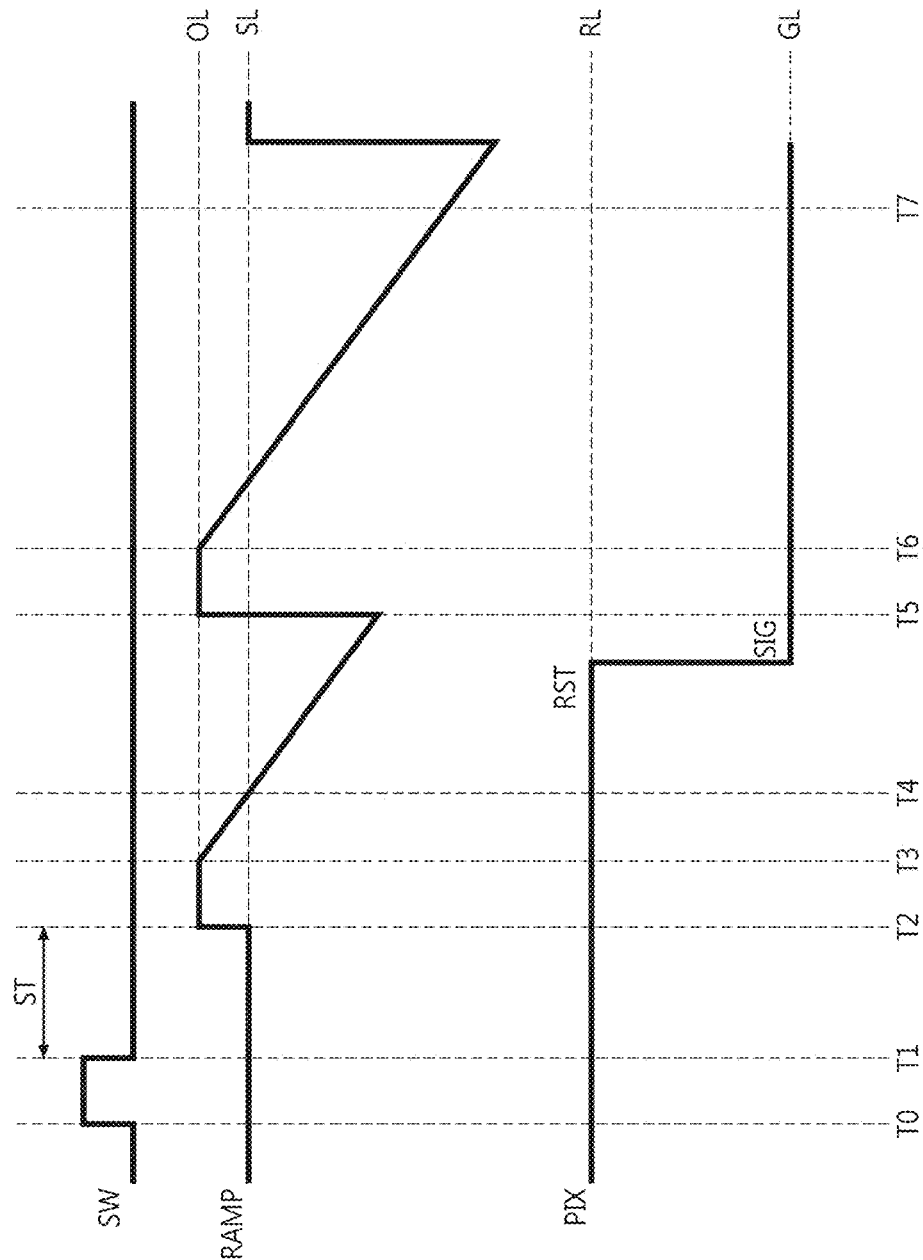
FIG. 9 is a timing diagram illustrating an operation of a CDS circuit according to some example embodiments of inventive concepts.

As illustrated in FIG. 9, the pixel signal PIX may include a reset signal RST or an image signal SIG.

The comparator 160 may compare an initial DC voltage of the pixel signal PIX output from the pixel 111 and an initial DC voltage of the ramp signal RAMP with each other, and output a comparison signal COMP corresponding to a result of comparing the initial DC voltages.

The first switch SW1 may connect the first input node INN of the comparator 160 to the output node OC and the second switch SW2 may connect the second input node INP of the comparator 160 to the comparison node R1, in response to the switch signal SW activated in an auto-zero period.

For example, the output node OC may be a positive output terminal of the comparator 160 and the comparison node R1 may be a negative output terminal of the comparator 160.

When the first input node INN of the comparator 160 is connected to the output node OC, levels of the pixel signal PIX stored in the first capacitor C1 and the comparison signal COMP become the same and thus reset noise of the pixel signal PIX and an offset of the comparator 160 may be removed.

Figure 4:
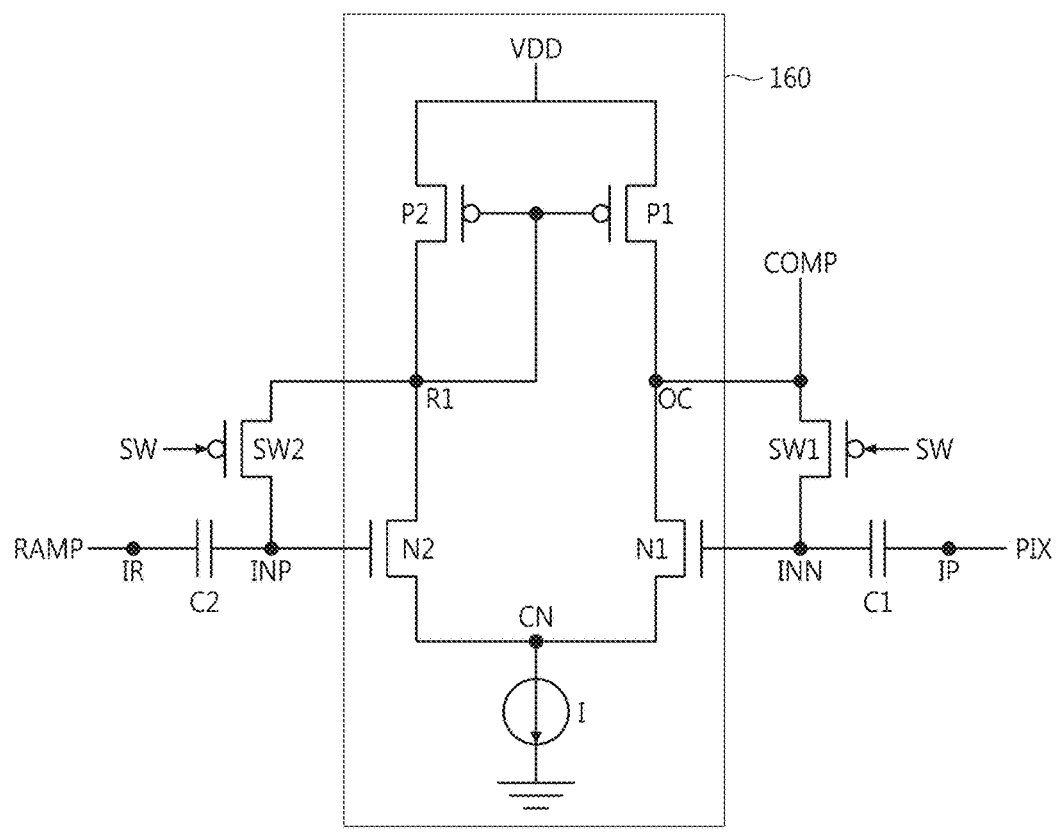
FIG. 4 is a more detailed circuit diagram of a CDS circuit according to some example embodiments of inventive concepts.

FIG. 4 is a more detailed circuit diagram of a CDS circuit 140 according to some example embodiments of inventive concepts. The CDS circuit 140 and a comparator 160 illustrated in FIG. 4 are respectively embodiments of the CDS circuit 140 and the comparator 160 illustrated in FIG. 3.

Referring to FIGS. 3 and 4, the CDS circuit 140 may include the comparator 160 and a peripheral circuit 151.

The comparator 160 may include a current source I and first to fourth transistors N1, N2, P1, and P2.

According to some example embodiments, the comparator 160 may include one or more operational transconductance amplifier (OTA) circuits. As illustrated in FIG. 4, the OTA circuits refer to a circuit including a plurality of transistors, a current-mirror circuit, and the current source I (for example, the comparator 160 of FIG. 4).

FIG. 4 illustrates the comparator 160 including one OTA circuit and the CDS circuit 140 including the comparator 160, but example embodiments of inventive concepts are not limited thereto.

According to some example embodiments, the comparator 160 may include two OTA circuits. In this case, the comparator 160 may include a first OTA circuit and a second OTA circuit. The first OTA circuit may be substantially the same as the comparator 160 of FIGS. 4 and 5 and the second OTA circuit may be embodied as an inverter to amplify an output signal of the first OTA circuit and output a comparison signal COMP which is an output signal of the comparator 160.

It will be hereinafter assumed that the comparator 160 includes one OTA circuit in a description with reference to FIGS. 4 and 5 below. The comparator 160 may compare a pixel signal PIX and a ramp signal RAMP with each other, and output the comparison signal COMP corresponding to a result of comparing the pixel signal PIX and the ramp signal RAMP with each other.

The first transistor P1 and the second transistor P2 may be each a PMOS transistor. A third transistor N1 and a fourth transistor N2 may be each a NMOS transistor.

For example, the first transistor P1 and the second transistor P2 may form a current-mirror circuit.

The first transistor P1 may be connected between a voltage generator VDD and an output node OC, and a gate thereof may be connected to a comparison node R1.

The second transistor P2 may be connected between the voltage generator VDD and the comparison node R1, and a gate thereof may be connected to the comparison node R1.

The third transistor N1 may be connected between a common node CN and the output node OC and a gate thereof may be connected to a first input node INN.

The fourth transistor N2 may be connected between the common node CN and the comparison node R1 and a gate thereof may be connected to a second input node INP.

The current source I may be connected between an earth terminal and the common node CN.

Referring to FIGS. 3 and 4, a peripheral circuit 151 may include a first switch SW1, a second switch SW2, a first capacitor C1, and a second capacitor C2.

The first and second switches SW1 and SW2 may be embodied as transistors. For example, the first switch SW1 and the second switch SW2 may be PMOS transistors.

As described above, the first capacitor C1 may be connected between a pixel signal input node IP and the first input node INN. The first switch SW1 may be connected between the first input node INN and a comparison signal output node OC. The second capacitor C2 may be connected between a ramp signal input node IR and the second input node INP. The second switch SW2 may be connected between the second input node INP and the comparison node R1.

The output node OC may output the comparison signal COMP.

Unlike that illustrated in FIG. 4, the current source I may be connected between the voltage generator VDD and the first and second transistors P1 and P2, but example embodiments of inventive concepts are not limited thereto.

The first to fourth transistors P1, P2, N1, and N2 may have a different transistor structure from those of the first and second switches SW1 and SW2, as will be described in detail with reference to FIGS. 6 to 8 below.

Figure 5:
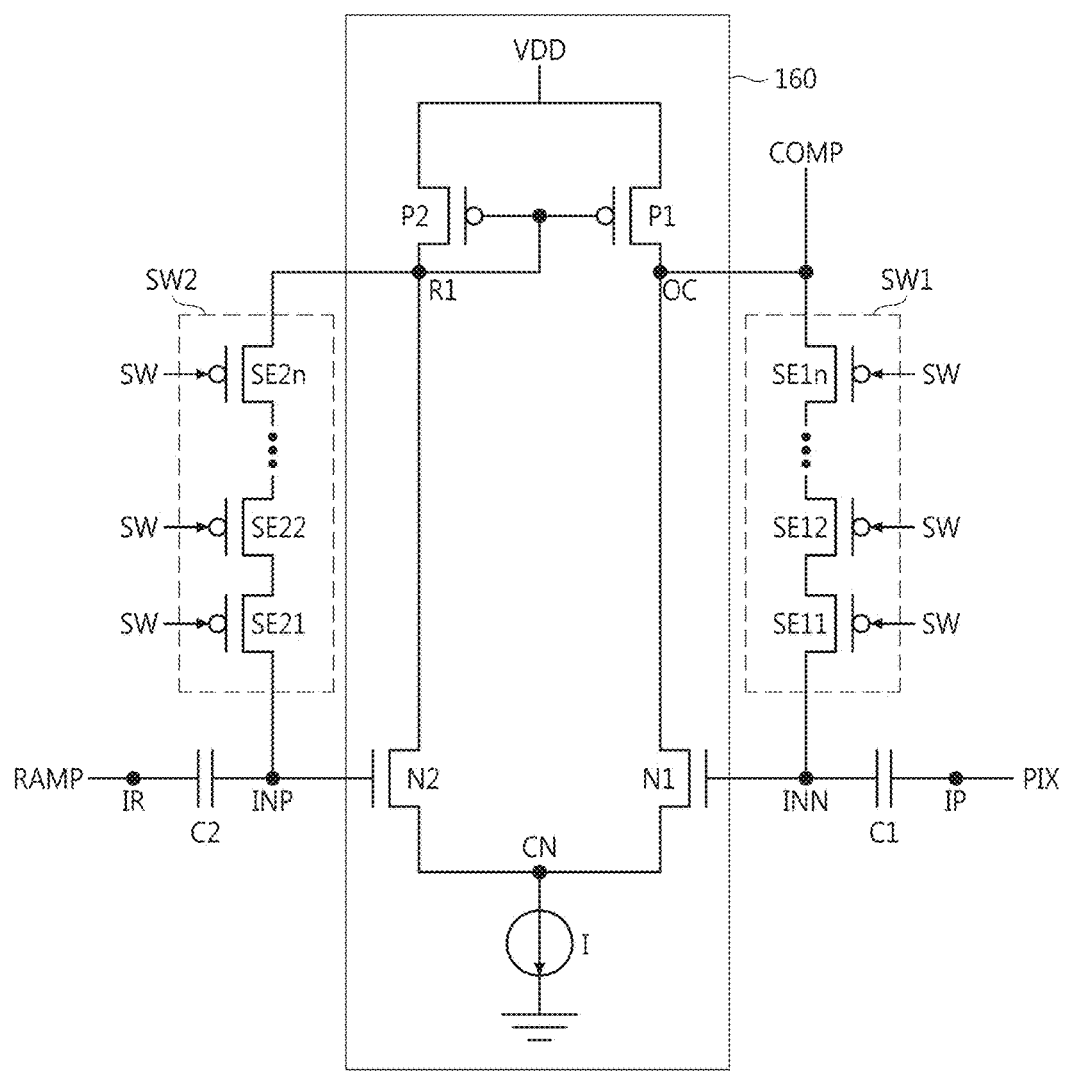
FIG. 5 is a more detailed circuit diagram of a CDS circuit according to some example embodiments of inventive concepts.

FIG. 5 is a more detailed circuit diagram of a CDS circuit according to some example embodiments of inventive concepts.

The CDS circuit of FIG. 5 will be described focusing on the differences from the CDS circuit 140 of FIG. 4 to avoid redundant description.

Referring to FIG. 5, a peripheral circuit 151 may include a first switch SW1, a second switch SW2, a first capacitor C1, and a second capacitor C2.

The first switch SW1 may include a plurality of first switch devices SE11 to SE1$n$. Here, n denotes an integer which is greater than or equal to '2'. The second switch SW2 may include a plurality of second switch devices SE21 to SE2$n$. Although FIG. 5 illustrates that the plurality of first switch devices SE11 to SE1$n$ and the plurality of second switch devices SE21 to SE2$n$ are the same in number, example embodiments of inventive concepts are not limited thereto.

Each of the plurality of first switch devices SE11 to SE1$n$ may be embodied as a transistor. For example, each of the plurality of first switch devices SE11 to SE1$n$ may be a PMOS transistor.

Each of the plurality of second switch devices SE21 to SE2n may be embodied as a transistor. For example, each of the plurality of second switch devices SE21 to SE2n may be a PMOS transistor.

The first to fourth transistors P1, P2, N1, and N2 may have a different transistor structure from those of the plurality of first switch devices SE11 to SE1n and the plurality of second switch devices SE21 to SE2n, as will be described in detail with reference to FIGS. 6 to 8 below.

Referring to FIG. 5, the first capacitor C1 may be influenced by only one switch device (e.g., the first switch device SE11) among the plurality of first switch devices SE11 to SE1n.

Similarly, the second capacitor C2 may be influenced by only one switch device (e.g., the second switch device SE21) among the plurality of second switch devices SE21 to SE2n.

Thus, when the amount of interface-trapped charges is decreased through the first switch device SE11 and the second switch device SE21, the first and second capacitors C1 and C2 may be more rapidly stabilized.

Figure 6:
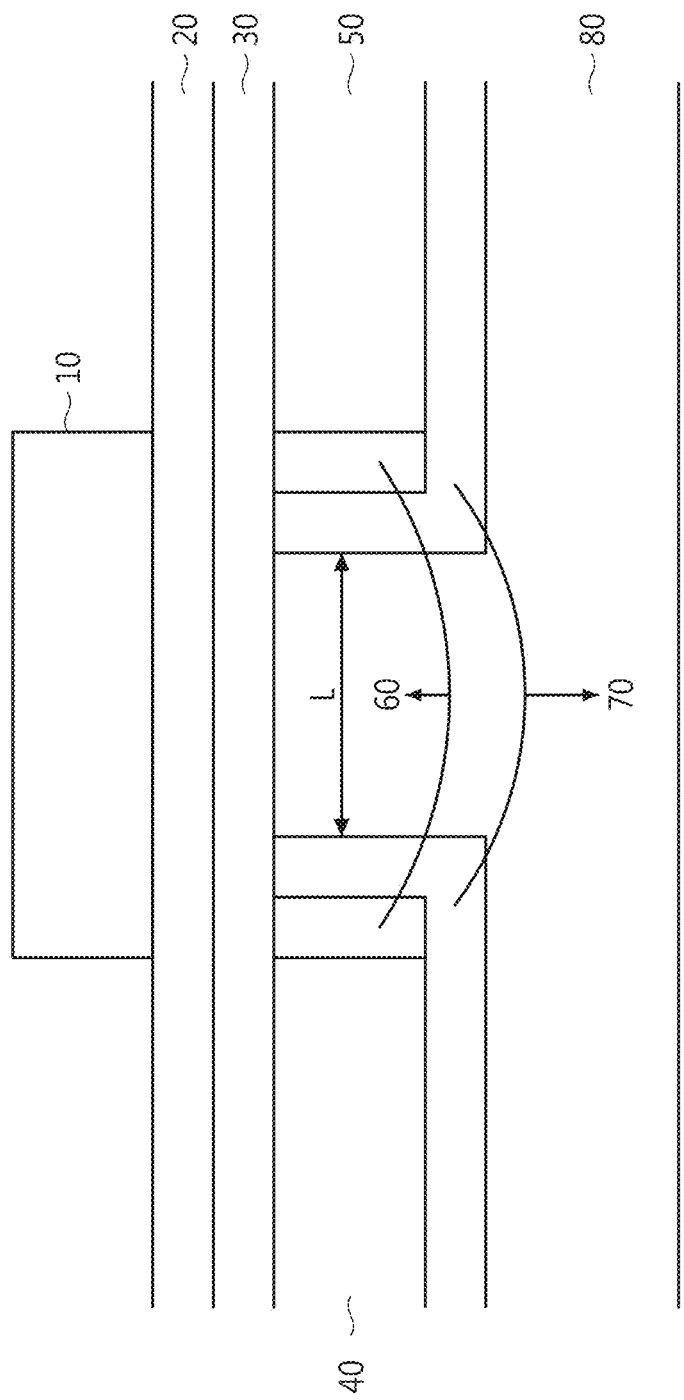
FIG. 6 is a schematic cross-sectional view of a transistor according to some example embodiments of inventive concepts.

FIG. 6 is a schematic cross-sectional view of a transistor according to some example embodiments of inventive concepts. FIG. 7 is a schematic cross-sectional view of a transistor according to some example embodiments of inventive concepts. FIG. 8 is a schematic cross-sectional view of a transistor according to some example embodiments of inventive concepts.

Figure 7:
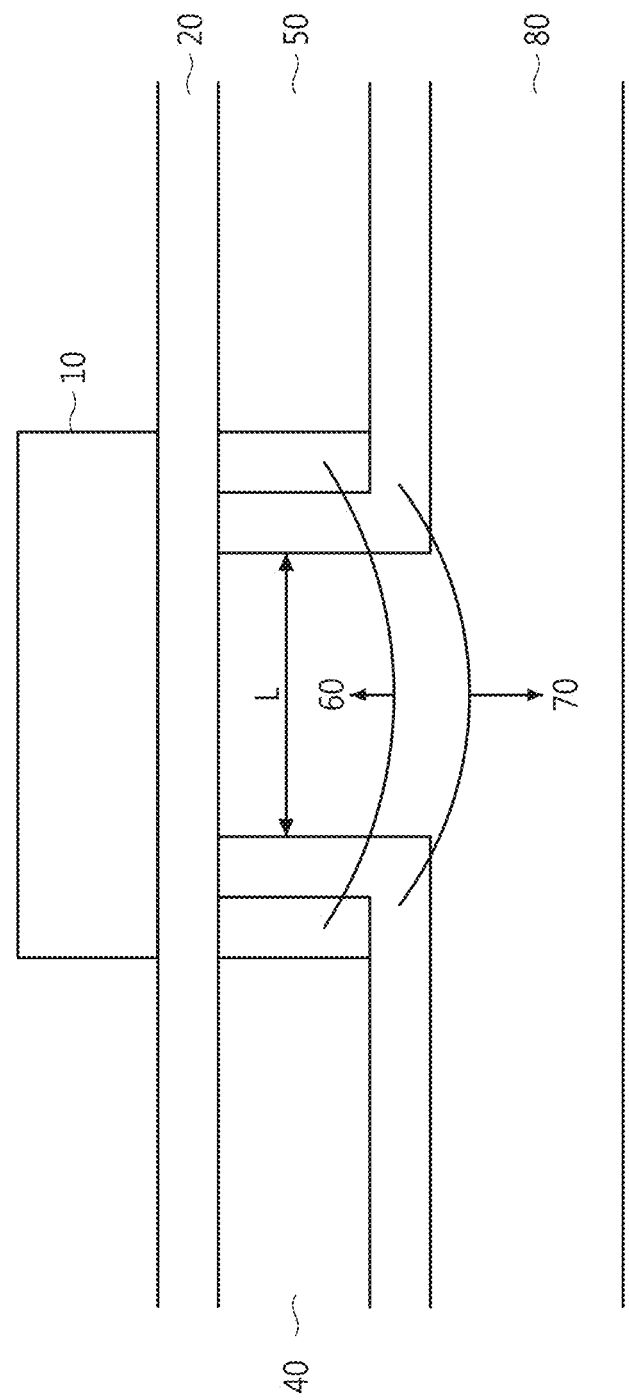
FIG. 7 is a schematic cross-sectional view of a transistor according to some example embodiments of inventive concepts.
Figure 8:
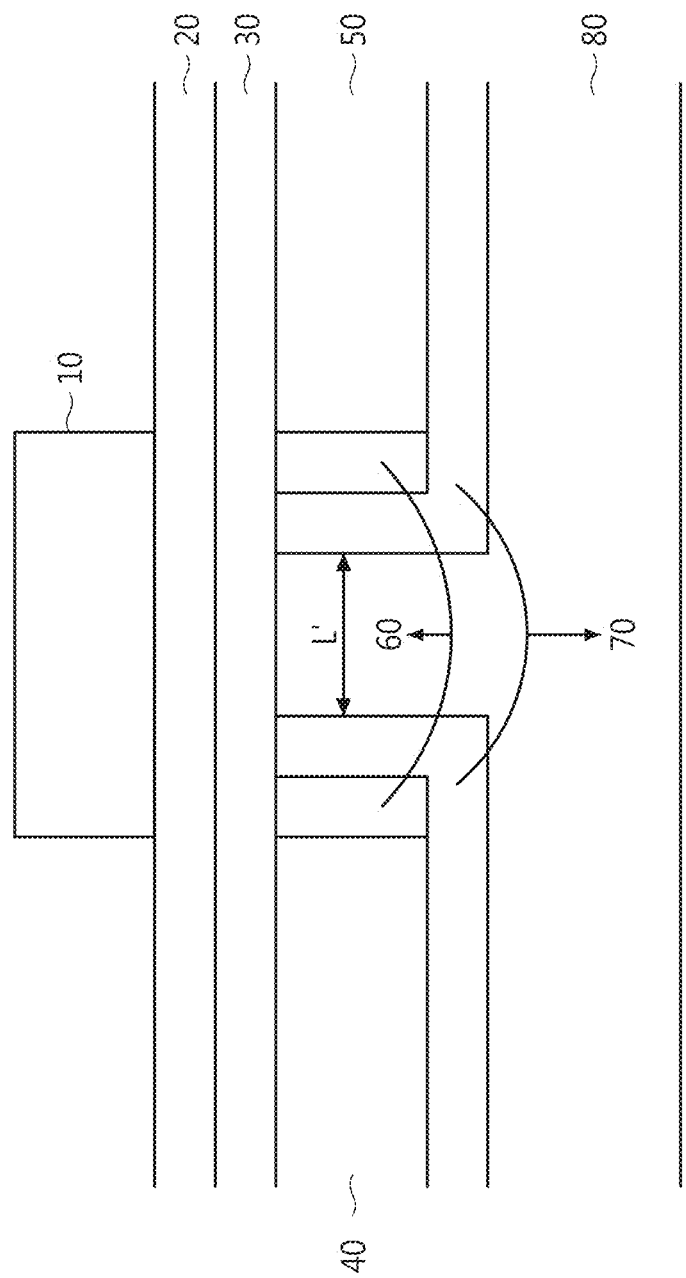
FIG. 8 is a schematic cross-sectional view of a transistor according to some example embodiments of inventive concepts.

In FIGS. 6 to 8, only main parts of the transistors are illustrated to briefly describe inventive concepts. Thus, some elements of the transistors may be omitted here.

The transistor illustrated in FIG. 6 may be substantially the same as the first to fourth transistors P1, P2, N1, and N2 of FIG. 4 or 5.

The transistor illustrated in FIG. 7 may be substantially the same as the first and second switches SW1 and SW2 of FIG. 4.

The transistor illustrated in FIG. 8 may be substantially the same as the first and second switch devices SE1 and SE2 of FIG. 5 or the first and second switches SW1 and SW2 of FIG. 4.

For convenience of explanation, the transistor of FIG. 6 is described as a PMOS transistor, but example embodiments of inventive concepts are not limited thereto. For example, the structure of FIG. 6 may be an NMOS transistor.

Referring to FIGS. 6 to 8, the transistor may include a gate 10, a gate insulating layer 20, a silicon-germanium (hereinafter referred to as 'cSiGe') layer 30, a source 40, a drain 50, and a substrate 80.

As generally known, when a gate voltage is applied to the gate 10, a channel may be formed between the source 40 and the drain 50, via which electric charges move. In this case, the length L of the channel is illustrated as the length between the source 40 and the drain 50 but example embodiments of inventive concepts are not limited thereto.

As the length L of the channel increases, interface charge trapping may occur more frequently.

The transistor may further include a low-doped region (not shown) and a halo region (not shown) between the source 40 and the drain 50.

The halo region may be a region formed to prevent a threshold voltage from decreasing when the length L of the channel decreases.

The cSiGe layer 30 may be formed above the substrate 80 of the transistor.

The cSiGe layer 30 may be a layer formed according to an epitaxial growth process to improve the performance of the PMOS transistor.

The gate insulating layer 20 may be formed on the cSiGe layer 30.

The gate 10 may be formed on the gate insulating layer 20.

A gate protective film (not shown) may be formed on sidewalls of the gate 10 to protect the gate 10.

When the transistor is a PMOS transistor, ions may be implanted into an N well in the substrate 80.

P+ ion implanted regions, i.e., the source 40 and the drain 50, may be formed at opposite sides of the gate 10 by implanting P+ ions thereinto.

The cSiGe layer 30 may decrease the threshold voltage but increases interface roughness with respect to other layers (e.g., the substrate 80 and the gate insulating layer 20). An increase in the interface roughness may result in a decrease in the reliability and performance of the transistor. For example, the cSiGe layer 30 may cause interface charge trapping to occur in the transistor.

Thus, in order to decrease interface charge trapping, a transistor in which the length L of the channel is decreased or from which the cSiGe layer 30 is removed may be used as a first switch or a second switch.

FIG. 7 is a schematic cross-sectional view of a transistor in which the cSiGe layer 30 is omitted on the basis of the above principle, according to other example embodiments of inventive concepts. Thus, the transistor of FIG. 7 may be substantially the same as the first switch SW1 or the second switch SW2 illustrated in FIG. 4.

FIG. 8 is a cross-sectional view of a transistor in which the length L' of a channel is shorter than the length L of the channel illustrated in FIG. 6, based on the above principle. That is, referring to FIGS. 6 and 8, the length L' of the channel of the transistor illustrated in FIG. 8 may be shorter than the length L of the channel of the transistor of FIG. 6.

The transistor of FIG. 8 is illustrated as including a cSiGe layer 30 but example embodiments of inventive concepts are not limited thereto.

The transistor of FIG. 8 may be substantially the same as the first and second switches SW1 and SW2 of FIG. 4. Alternatively, the transistor of FIG. 8 may be substantially the same as the first and second switch devices SE1 and SE2 of FIG. 5.

FIG. 9 is a timing diagram illustrating an operation of a CDS circuit according to some example embodiments of inventive concepts.

It is assumed that a range of a pixel signal PIX and a range of a ramp signal RAMP are within an input range of the comparator 160.

Referring to FIG. 9, a switch signal SW may change from a low level to a high level, i.e., this signal may change to be 'on', at a point of time T0.

The ramp signal RAMP may have a starting voltage level SL. A reset signal RST included in the pixel signal PIX may have a reset level RL.

Referring to FIGS. 1 to 4, in a period T0 to T1, since the switch signal SW is 'on', the first input node INN and the output node OC may be connected to each other and the second input node INP and the comparison node R1 may be connected to each other.

The timing controller 165 may control the switch signal SW.

At a point of time T1, the switch signal SW may change from the high level to the low level, i.e., this signal may change to be 'off'.

A period T1 to T2 is referred to as a settling time ST. The settling time ST may be understood as a time to stabilize the CDS circuit 140.

In a period T0 to T2, a comparison signal COMP may be a signal corresponding to the difference between the ramp signal RAMP having the starting voltage level SL and the pixel signal PIX having the reset level RL (e.g., the reset signal RST). For example, the starting voltage level SL and the reset level RL may be substantially the same.

The settling time ST may be understood as a time for the ramp signal RAMP to change to an offset level OL after a switch is 'off' according to the switch signal SW as illustrated in FIG. 9. However, example embodiments of inventive concepts are not limited thereto.

The settling time ST may increase due to either a potential barrier of an energy band caused by implantation of a halo-region dopant material or an interface trap.

According to an example embodiment of inventive concepts, the settling time ST may be prevented from increasing in units of several μs due to the interface trap.

When the settling time ST decreases, a time to perform a whole ADC operation decreases to enable an HFR operation of the image sensing system 1.

At a point of time T2, the ramp signal RAMP increases by a certain offset and thus changes from the starting voltage level SL to the offset level OL. The offset level OL may be higher than the reset level RL.

In a period T2 to T3, the comparison signal COMP may correspond to the difference between the ramp signal RAMP having the offset level OL and the pixel signal PIX having the reset level RL, e.g., the reset signal RST.

At a point of time T3, a ramp enable signal may be supplied to the ramp signal generator 155 to activate the ramp signal RAMP.

In this case, the activation of the ramp signal RAMP means that the ramp signal RAMP decreases by a certain degree, starting from the offset level OL.

In a period T3 to T4, the comparison signal COMP may correspond to the difference between the ramp signal RAMP decreasing by the certain degree and the pixel signal PIX having the reset level RL, e.g., the reset signal RST.

In a period T4 to T5, the pixel signal PIX may change from the reset level RL to a signal level GL. In a period T4 to T5, the comparison signal COMP may correspond to the difference between the ramp signal RAMP decreasing by the certain degree and the pixel signal PIX having the signal level GL, e.g., the image signal SIG.

At a point of time T5, the ramp signal RAMP may change to the offset level OL.

In a period T5 to T6, the comparison signal COMP may correspond to the difference between the ramp signal RAMP having the offset level OL and the pixel signal PIX having the signal level GL, e.g., the image signal SIG.

At a point of time T6, the ramp enable signal may be supplied to the ramp signal generator 155 to activate the ramp signal RAMP.

In a period T6 to T7, the comparison signal COMP may correspond to the difference between the ramp signal RAMP decreasing by the certain degree and the pixel signal PIX having the signal level GL, e.g., the image signal SIG.

Figure 10:
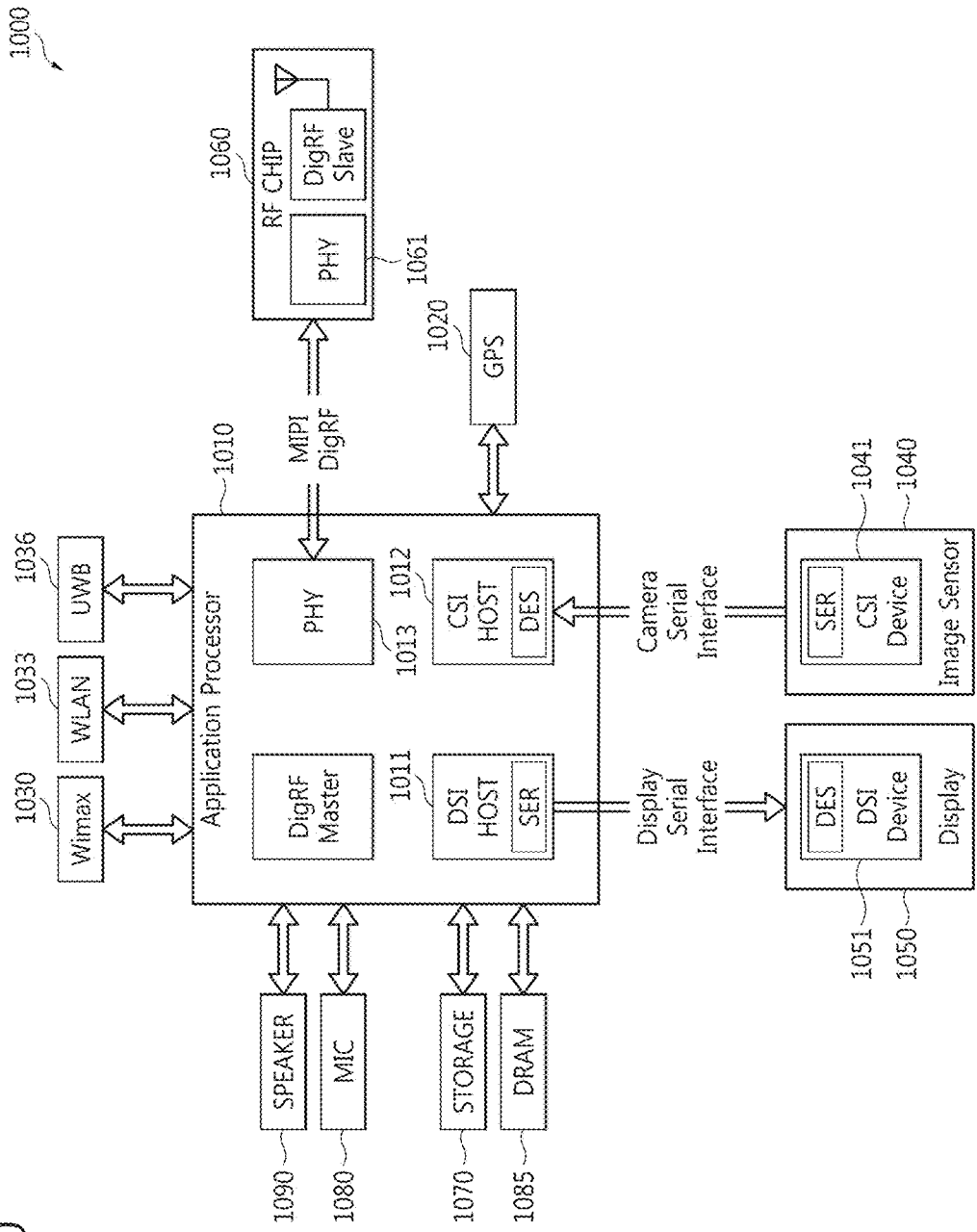
FIG. 10 is a schematic block diagram of an image sensing system including an image sensor according to some example embodiments of inventive concepts.

FIG. 10 is a schematic block diagram of an image sensing system including an image sensor according to some example embodiments of inventive concepts. Referring FIG. 10, the image sensing system 1000 may be implemented by a data processing apparatus, such as a mobile phone, a personal digital assistant (PDA), a portable media player (PMP), or a smart phone that can use or support the Mobile Industry Processor Interface (MIPI). The image sensing system 1000 includes an application processor 1010, an image sensor 1040, and a display 1050.

A camera serial interface (CSI) host 1012 included in the application processor 1010 performs serial communication with a CSI device 1041 included in the image sensor 1040 through CSI. For example, an optical de-serializer (DES) may be implemented in the CSI host 1012, and an optical serializer (SER) may be implemented in the CSI device 1041. The image sensor 1040 corresponds to the image sensor 100 described in FIG. 1 through FIG. 9.

A display serial interface (DSI) host 1011 included in the application processor 1010 performs serial communication with a DSI device 1051 included in the display 1050 through DSI. For example, an optical serializer may be implemented in the DSI host 1011, and an optical de-serializer may be implemented in the DSI device 1051.

The image sensing system 1000 may also include a radio frequency (RF) chip 1060 which communicates with the application processor 1010. A physical layer (PHY) 1013 of the image sensing system 1000 and a PHY of the RF chip 1060 communicate data with each other according to a MIN DigRF standard. The image sensing system 1000 may further include at least one element among a GPS 1020, a storage device 1070, a microphone 1080, a dynamic random access memory (DRAM) 1085 and a speaker 1290. The image sensing system 1000 may communicate using Wimax (World Interoperability for Microwave Access) 1030, WLAN (Wireless local area network) 1033 or UWB (Ultra Wideband) 1036, etc.

Figure 11:
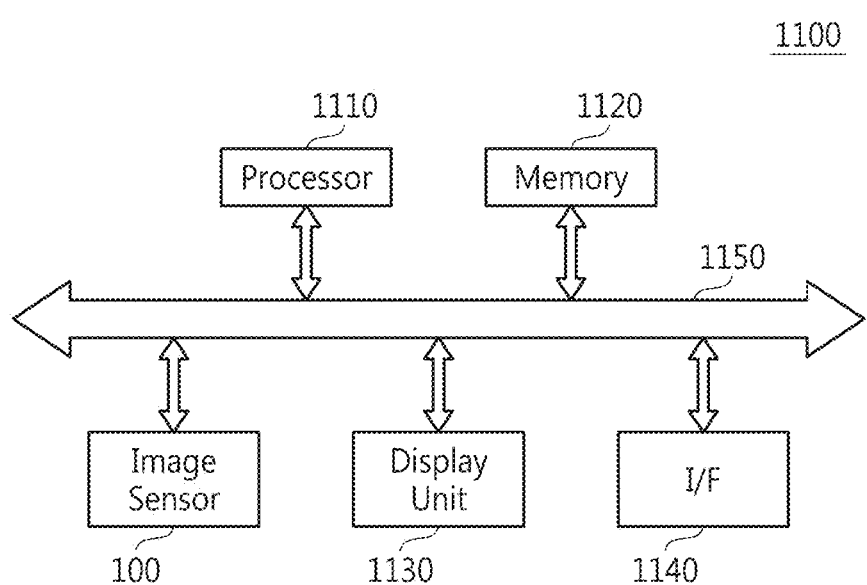
FIG. 11 is a block diagram of an electronic system including the image sensor illustrated in FIG. 1 according to other example embodiments of inventive concepts.

FIG. 11 is a block diagram of an electronic system 1100 including the image sensor 100 illustrated in FIG. 1 according to other example embodiments of inventive concepts. Referring to FIGS. 1 and 11, the electronic system 1100 may include the image sensor 100, a processor 1110, a memory 1120, a display unit 1130, and an I/F 1140.

The processor 1110 may control the operation of the image sensor 100. The processor 1110 may generate a two or three dimensional image based on depth information and color information (e.g., at least one among red information, green information, blue information magenta information, cyan information, and yellow information) from the image sensor 100.

The memory 1120 may store a program for controlling the operation of the image sensor 100 through a bus 1150 according to the control of the processor 1110 and may also store the image. The processor 1110 may access the memory 1120 and execute the program. The memory 1120 may be formed as a non-volatile memory.

The image sensor 100 may generate two or three dimensional image information based on a digital pixel signal (e.g., color information or depth information) under the control of the processor 1110.

The display unit 1130 may receive the image from the processor 1110 or the memory 1120 and display the image on a display (e.g., a liquid crystal display (LCD) or an active-matrix organic light emitting diode (AMOLED) display). The I/F 1140 may be formed for the input and output of the two or three dimensional image. The I/F 1140 may be implemented as a wireless I/F.

Inventive concepts can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish inventive concepts can be easily construed by programmers.

According to various example embodiments of inventive concepts, a CDS circuit employs a transistor having no cSiGe layer as an auto-zero switch, unlike transistors configured as comparators. Accordingly, interface roughness may decrease, thereby decreasing charge trapping.

Furthermore, in an image sensor including a CDS circuit according to an example embodiment of inventive concepts, charge trapping decreases, thereby decreasing a pixel settling time.

In an image sensing system including an image sensor according to an example embodiment of inventive concepts, a HFR may be realized to decrease column fixed pattern noise (CFPN).

While inventive concepts have been particularly shown and described with reference to the example embodiments illustrated in the drawings, these embodiments are merely examples. It would be obvious to those of ordinary skill in the art that these embodiments are to cover all modifications, equivalents, and alternatives falling within the scope of the inventive concept. Accordingly, the technical scope of inventive concepts should be defined based on the technical idea of the appended claims.

What is claimed is:

1. A correlated double sampling (CDS) circuit comprising:
   a comparator configured to compare a pixel signal and a ramp signal with each other and output a comparison signal corresponding to a result of comparing the pixel signal and the ramp signal with each other; and
   a first switch and a second switch, each of the first switch and the second switch configured to remove an offset component of the comparator,
   wherein the first switch and the second switch are configured to decrease a settling time between when switching operations of the first switch and the second switch are performed and when analog-digital conversion (ADC) is performed.

2. The CDS circuit of claim 1, wherein the first switch is configured to connect a first input node and an output node to each other,
   the second switch is configured to connect a second input node and a comparison node to each other,
   the comparator is configured to receive the pixel signal via the first input node, and
   the comparator is configured to receive the ramp signal via the second input node.

3. The CDS circuit of claim 2, wherein the comparator comprises:
   a first transistor operably connected between a voltage generator and the output node and including a gate connected to the comparison node;
   a second transistor operably connected between the voltage generator and the comparison node and including a gate connected to the comparison node;
   a third transistor operably connected between a common node and the output node and including a gate connected to the first input node; and
   a fourth transistor operably connected between the common node and the comparison node and including a gate connected to the second input node,
   wherein to the gate of the third transistor is configured to receive the pixel signal, and the gate of the fourth transistor is configured to receive the ramp signal.

4. The CDS circuit of claim 3, wherein each of the first to fourth transistors and the first and second switches is a transistor comprising:
   a substrate of the transistor;
   a gate insulating layer formed on the substrate;
   a gate formed on the gate insulating layer; and
   a source and a drain formed at opposite sides of the gate by implanting ions,
   wherein each of the first to fourth transistors further comprises a silicon-germanium (cSiGe) layer formed between the substrate and the gate insulating layer.

5. The CDS circuit of claim 1, wherein the first switch and the second switch are transistors to which a silicon-germanium (cSiGe) process is not applied.

6. The CDS circuit of claim 3, wherein the first switch comprises a plurality of first switch devices operably connected in series, and
   the second switch comprises a plurality of second switch devices operably connected in series.

7. The CDS circuit of claim 6, wherein each of the first to fourth transistors, the plurality of first switch devices, and the plurality of second switch devices is a transistor comprising:
   a substrate of the transistor;
   a gate insulating layer formed on the substrate;
   a gate formed on the gate insulating layer; and
   a source and a drain formed at opposite sides of the gate by implanting ions,
   wherein each of the first to fourth transistors further comprises a silicon-germanium (cSiGe) layer formed between the gate insulating layer and the substrate.

8. The CDS circuit of claim 3, wherein each of the first to fourth transistors and the first and second switches is a transistor comprising:
   a substrate of the transistor;
   a gate insulating layer formed on the substrate;
   a gate formed on the gate insulating layer; and
   a source and a drain formed at opposite sides of the gate by implanting ions,
   wherein the first switch and the second switch are transistors having a length of a channel which is shorter than lengths of channels of the first to fourth transistors,
   wherein the length of the channel is equal to a horizontal distance between the source and the drain.

9. The CDS circuit of claim 1, further comprising:
   a first capacitor operably connected to a pixel node and a first input node; and
   a second capacitor operably connected to a ramp node and a second input node,
   wherein the first capacitor and the second capacitor are configured to block a direct-current of the pixel signal and the ramp signal.

10. The CDS circuit of claim 3, wherein the first switch, the second switch, the third transistor, and the fourth transistor are P-MOS transistors, and
    the first transistor and the fourth transistor are N-MOS transistors.

11. An image sensor including a pixel array having a plurality of pixels for outputting a pixel signal, a ramp signal generator for outputting a ramp signal, and a correlated double sampling (CDS) circuit, wherein the CDS circuit comprises:
    a first capacitor configured to receive a pixel signal;
    a second capacitor configured to receive a ramp signal;

a comparator configured to compare the pixel signal and the ramp signal with each other and output a comparison signal corresponding to a result of comparing the pixel signal and the ramp signal with each other; and a first switch and a second switch, each of the first switch and the second switch configured to remove an offset component of the comparator, wherein the first switch and the second switch are configured to decrease a settling time between when switching operations of the first switch and the second switch are performed and when analog-digital conversion (ADC) is performed, and the first switch and the second switch are transistors to which a silicon-germanium (cSiGe) process is not applied.

12. The image sensor of claim 11, wherein the first switch is configured to connect a first input node and an output node to each other, the second switch is configured to connect a second input node and a comparison node to each other, the comparator is configured to receive the pixel signal via the first capacitor, the first capacitor operably connected to the first input node, and the comparator is configured to receive the ramp signal via the second capacitor, the second capacitor operably connected to the second input node.

13. The image sensor of claim 12, wherein the comparator comprises:

a first transistor operably connected between a voltage generator and the output node and including a gate connected to the comparison node;

a second transistor operably connected between the voltage generator and the comparison node and including a gate connected to the comparison node;

a third transistor operably connected between a common node and the output node and including a gate connected to the first input node; and a fourth transistor operably connected between the common node and the comparison node and including a gate connected to the second input node.

14. The image sensor of claim 13, wherein each of the first to fourth transistors and the first and second switches is a transistor comprising:

a substrate of the transistor;
a gate insulating layer formed on the substrate;
a gate formed on the gate insulating layer; and
a source and a drain formed at opposite sides of the gate by implanting ions, and each of the first to fourth transistors further comprises a silicon-germanium (cSiGe) layer formed between the substrate and the gate insulating layer.

15. The image sensor of claim 11, wherein the first capacitor and second capacitor are configured to block direct-current of the pixel signal and the ramp signal.

* * * * *